US007537464B2

(12) United States Patent
Brandenburg et al.

(10) Patent No.: US 7,537,464 B2
(45) Date of Patent: May 26, 2009

(54) ELECTRICAL PIN INTERCONNECTION FOR ELECTRONIC PACKAGE

(75) Inventors: Scott D. Brandenburg, Kokomo, IN (US); Thomas A. Degenkolb, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 403 days.

(21) Appl. No.: 11/473,647

(22) Filed: Jun. 23, 2006

(65) Prior Publication Data

US 2007/0295450 A1 Dec. 27, 2007

(51) Int. Cl.
*H01R 12/00* (2006.01)
*H05K 1/00* (2006.01)

(52) U.S. Cl. ........................................ 439/76.1; 439/78

(58) Field of Classification Search ................ 439/76.1, 439/78, 83, 296; 156/293
See application file for complete search history.

(56) References Cited

U.S. PATENT DOCUMENTS 4,927,372 A * 5/1990 Collier ........................ 439/83
4,978,308 A * 12/1990 Kaufman ..................... 439/83
5,456,615 A 10/1995 Tang et al.
5,759,047 A * 6/1998 Brodsky et al. ............... 439/66
6,217,346 B1 * 4/2001 Cubon ......................... 439/78
7,149,089 B2 * 12/2006 Blasko et al. ............... 361/752
7,234,950 B1 * 6/2007 Wickett ....................... 439/78
2005/0026478 A1 * 2/2005 Chiang ........................ 439/83
2005/0280032 A1 12/2005 Hutter, III
2007/0026700 A1 * 2/2007 Brandenburg et al. ......... 439/83

* cited by examiner

*Primary Examiner*—Hae Moon Hyeon
(74) *Attorney, Agent, or Firm*—Jimmy L. Funke

(57) ABSTRACT

An electrical connector assembly and method of connecting an electrical connector to a substrate are provided. The electrical connector assembly includes a substrate having electrical circuitry, a shroud, and a plurality of conductive pins. The conductive pins are pressed into contact with contact pads of the electrical circuitry. The electrical connector assembly also includes an overmolding material securing the shroud such that the conductive pins contact the electrical circuitry.

21 Claims, 4 Drawing Sheets

ELECTRICAL PIN INTERCONNECTION FOR ELECTRONIC PACKAGE

TECHNICAL FIELD

The present invention generally relates to electrical circuit connections, and more particularly relates to an electrical interconnection between a substrate and an electrical device without requiring the need for a solder joining process.

BACKGROUND OF THE INVENTION

Electronic packages commonly employ various surface mount electronic devices connected to electrical circuitry on a substrate, such as a printed circuit board. The printed circuit board generally includes a dielectric substrate in single or multiple layers and electrical circuitry typically in the form of conductive circuit traces. The electrical circuitry also typically includes electrical conductive contact pads for making electrical connections to electrical components, such as surface mount devices. Various types of electrical connectors exist for forming the electrical connection between the surface mount components and the electrical circuitry on the substrate.

Thru-hole electrical connectors have been employed for use in automotive electronic controllers and other applications. The conventional thru-hole connectors are generally reliable and robust, however, a number of disadvantages exist. With surface mount technology, many electronic packages require a solder reflow process to manufacture the circuit assembly. When using a thru-hole connector, an additional manufacturing process is typically required to mount the electrical connector to the circuit board, such as a wave or selective wave solder or pin-in-paste process. Additionally, the thru-hole connector typically consumes all layers of the circuit board and, thus, the connector footprint area generally cannot be used for other purposes.

Another conventional surface mount connector technology employs the use of gull wing-type surface mount connectors which are soldered to the surface of the circuit board. These types of connectors have been employed in the automotive environment. However, gull wing-type surface mount connectors have low shear force ratings and may experience reliability problems due to cracked solder joint interconnections between the connector leads and the printed circuit board. Additionally, the ceramic-based packages generally use a wire bonded connector header. The wire bonding process can be cumbersome and also typically adds a manufacturing process step.

It is therefore desirable to provide for a reliable electrical connection that enables electrical interconnection between the circuit board and another electrical device in a manner that is easy to manufacture. It is further desirable to provide for such an electrical connector that consumes a small amount of the substrate and does not require application of a solder connection process.

SUMMARY OF THE INVENTION

In accordance with the teachings of the present invention, an electrical connector assembly and method of assembling an electrical connector to a substrate are provided. According to one aspect of the present invention, the electrical connector assembly includes a substrate and electrical circuitry formed on the substrate. The electrical connector assembly also has an electrically conductive pin having at least one pointed member disposed at least partially in contact with the electrical circuitry on the substrate. The electrical connector assembly further includes a holder for securing the conductive pin such that the pointed member of the conductive pin is held in contact with the electrical circuitry on the substrate.

According to another aspect of the present invention, an electrical connector assembly is provided that includes a substrate having electrical circuitry including a contact pad. The connector assembly has an electrically conductive pin pressed into contact with the contact pad. The electrical connector assembly also includes a shroud engaged to the conductive pin. The assembly further includes an overmolding material disposed at least partially between the shroud and the substrate to secure the conductive pin in contact with the contact pad.

According to a further aspect of the present invention, a method of assembling an electrical connector assembly to a substrate is provided. The method includes the step of providing a substrate having electrical circuitry. The method includes the step of disposing an electrically conductive pin on the electrical circuitry, and forcing the conductive pin into contact with the second electrical circuitry on the substrate. The method further includes the step of holding the conductive pin such that the conductive pin maintains contact with the electrical circuitry.

Accordingly, the electrical connector assembly and method of the present invention advantageously do not require a solder connection process to connect the conductive pin and electrical circuitry. According to some aspects, the electrical connector assembly consumes a small amount of volume, and is easy to manufacture to provide a reliable connector assembly.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
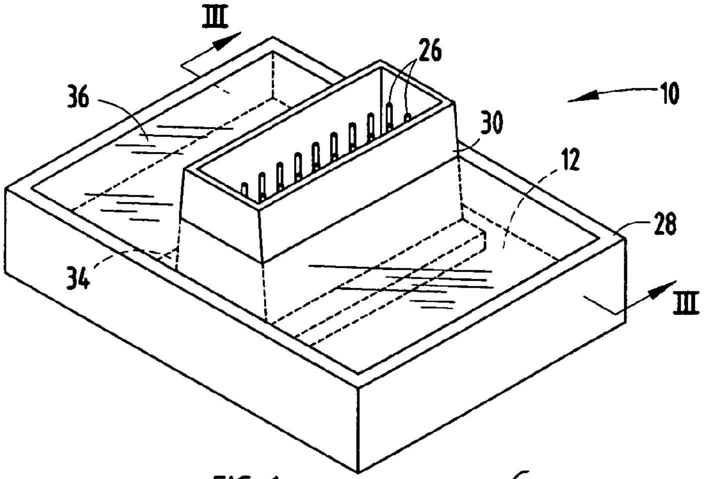
FIG. 1 is a perspective view of an electronic package employing an electrical connector assembly according to a first embodiment of the present invention.
Figure 2:
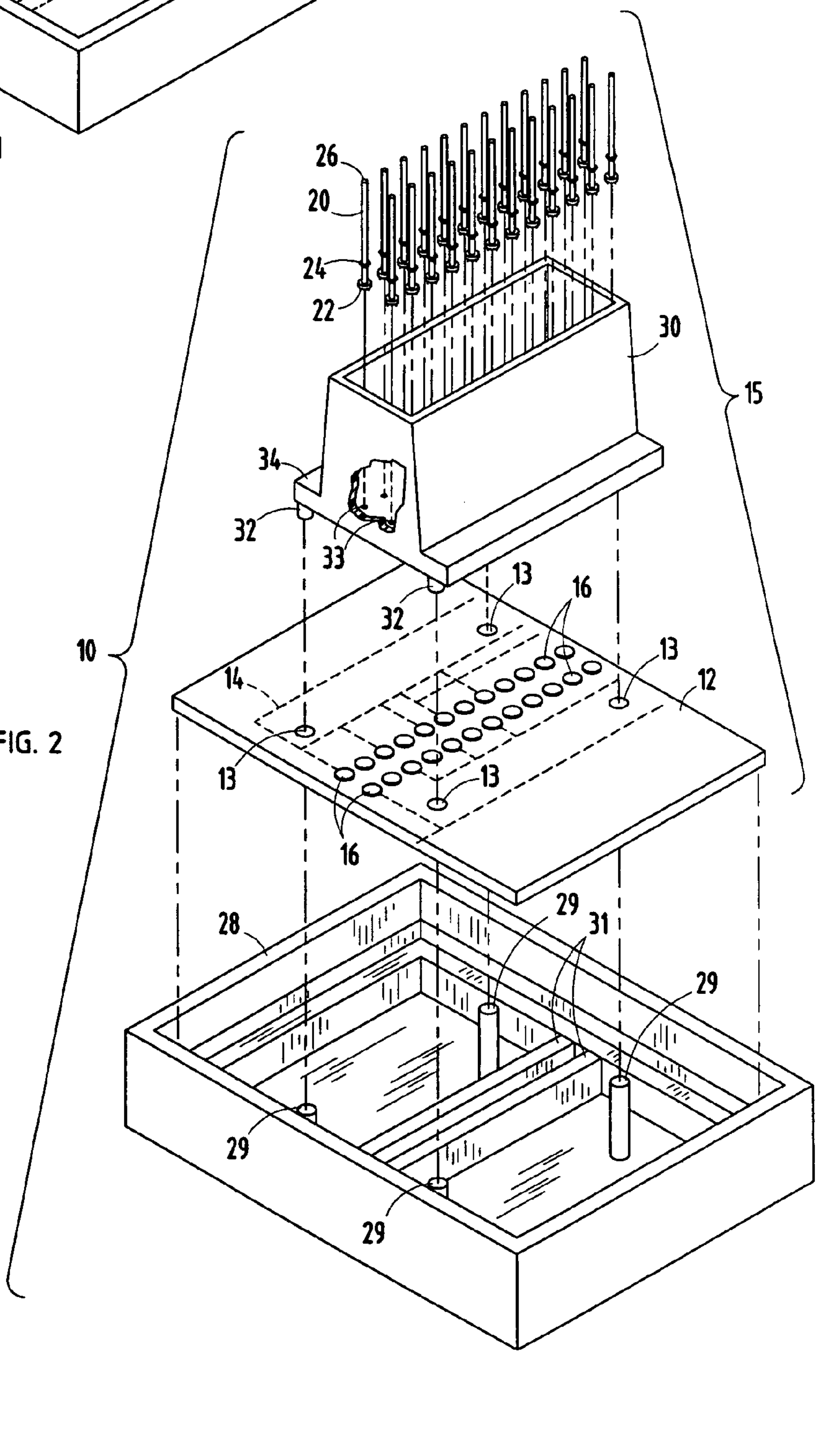
FIG. 2 is an exploded view of the electronic package shown in FIG. 1 absent the overmolding material.
Figure 3:
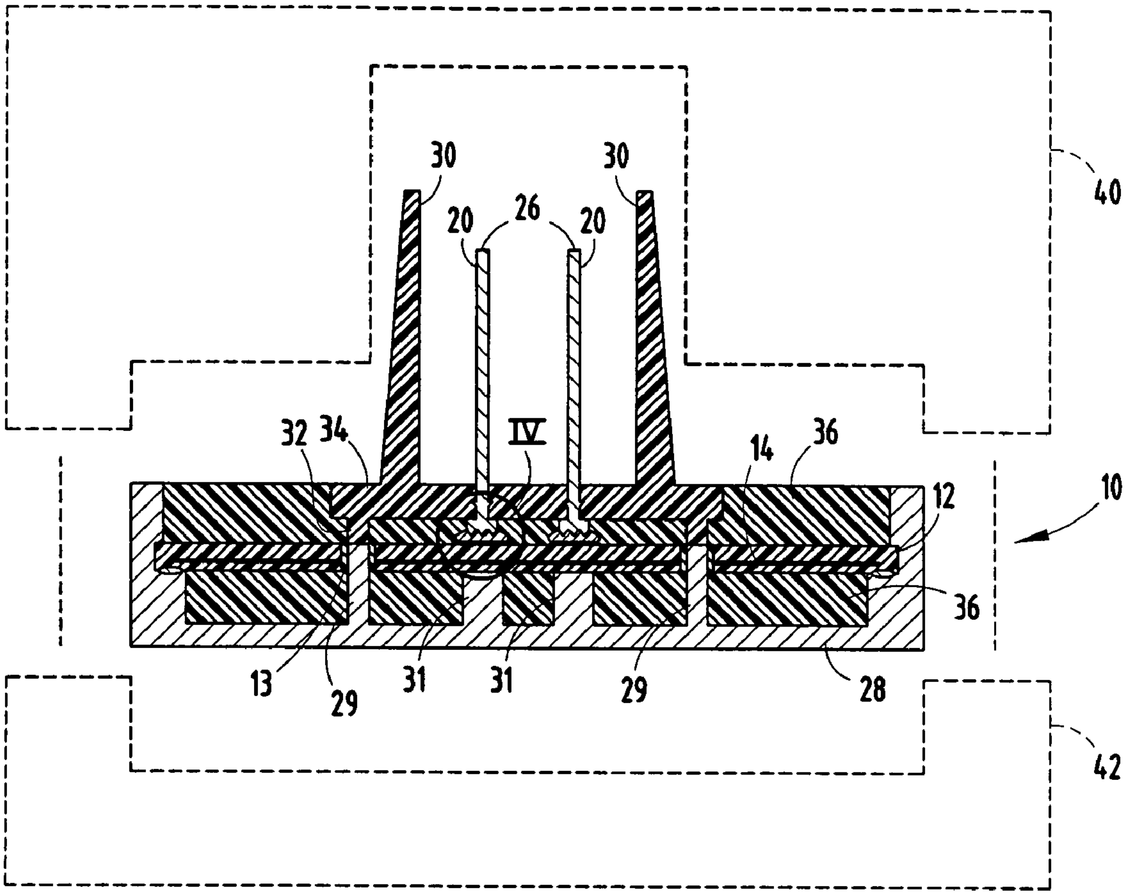
FIG. 3 is a cross-sectional view taken through line III-III in FIG. 1 illustrating the electronic package overmold assembly and the mold in dashed lines.
Figure 4:
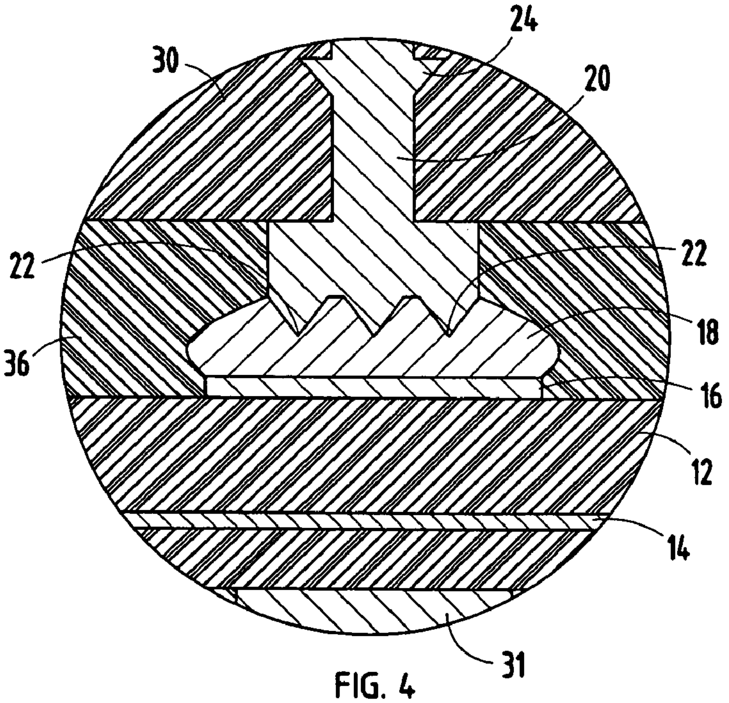
FIG. 4 is an enlarged cross-sectional view of section IV of the connector assembly shown in FIG. 3.

Referring now to FIGS. 1-4, an overmolded electronic package 10 is generally illustrated having an electrical connector assembly 15 including electrically conductive pins 20 and a shroud 30 assembled onto a circuit board 12. The electronic package 10 includes a backplate 28 and a circuit board 12 (also referred to as the substrate) provided on top thereof. The electrically conductive pins 20 connect a first terminal end to electrical circuitry on the circuit board 12 and provides rigid connector pin terminals 26 at the second opposite end within shroud 30 that allow for connection to an external device, such as a surface mount device (not shown). The electrical connector assembly 15 enables electrical connection of any of the various types of electrical devices to the circuit board 12, without requiring a solder connection reflow process.

The substrate 12 is shown disposed on top of backplate 28, such as an aluminum plate that provides a support structure in the bottom and side walls. The backplate 28 may have upstanding pins 29 and ribs 31 extending from the bottom wall. Pins 29 are aligned to extend into holes 13 formed in substrate 12. Pins 29 and ribs 31 support and align the substrate 12. The substrate 12 may be otherwise configured with or without a backplate.

The substrate 12 may employ a known substrate material, such as low temperature co-fired ceramic (LTCC) or FR4, and may be a rigid or non-rigid substrate. The substrate 12, described in one exemplary embodiment as a printed circuit board, has first electrical circuitry formed on the top surface thereof including contact pads 16. The contact pads 16 have an exposed surface for contacting the terminal ends of connector pins 20 to form the electrical connections according to the present invention. The substrate 12 may further include electrical circuitry extending through the substrate, including circuitry 14 formed in intermediate layers and on the bottom surface. It is also contemplated that one or more electrical devices may be connected via one or more electrical connector assemblies 15 to the top, bottom and/or side walls of the substrate 12, without departing from the teachings of the present invention.

The electrical connector assembly 15 provides for easy to assemble and reliable electrical interconnection between the circuit board 12 and other electrical device(s). The electrical connector assembly 15 includes one or more electrically conductive pins 20. The conductive pins 20 are disposed adjacent to and aligned with the contact pads 16 on circuit board 12, and are forced into contact therewith by way of a holder. In the embodiment shown, twenty-four conductive pins 20 are shown mounted within a single shroud 30 and arranged in two parallel rows. However, it should be appreciated that one or more electrically conductive pins 20 may be employed in various arrangements in the electrical connector assembly 15 according to the present invention.

The conductive pins 20 are shown generally configured as elongated cylindrical shaft pins having a first terminal end with one or more pointed members 22 for contacting electrical circuitry 16 on the substrate 12 and an opposite second end 26 for allowing connection to an external electrical device (not shown). The conductive pins 22 are made of an electrically conductive material such as copper, or a copper alloy such as beryllium copper or brass. The elongated shafts of the conductive pins 20 are shown extending through respective openings 33 in a bottom wall of the shroud 30 and each includes a barb 24 connected or locked within the respective opening 33 to the shroud 30. The shroud 30 is a dielectric such as plastic that may be molded around the conductive pins 20 to form the integral assembly. The first terminal end of each conductive pin 20 has one or more pointed members 22 (e.g., teeth). In the embodiment shown in FIG. 4, three teeth 22 are seen in the cross section. However, one or more pointed members 22 may be employed on the first terminal end to forcibly dig into the electrical circuitry 16 on the substrate 12. The totality of the conductive pins 20 and shroud 30 essentially form an electrical terminal for matingly engaging electrically conductive receivers within another connecting terminal.

The shroud 30 is shown having an upper flat surface 34 around the perimeter and ribs or pegs 32 on the bottom surface. The shroud 30 is disposed on top of substrate 12 and may be aligned therewith by ribs or pegs 32 engaging slots or holes 13 in substrate 12. A mold assembly made up of upper mold member 40 and lower mold member 42 forces the shroud 30 on the upper peripheral surface 34 to be forced toward the circuit board 12 so as to drive the conductive pins 20 at the first terminal end with pointed members 22 into the contact pad 16 on substrate 12. In the embodiment shown in FIGS. 1-4, the contact pads 16 are each formed of a copper layer and an overlying solder layer 18 formed on top thereof. The first terminal end of each conductive pin 20 is forced into the solder layer 18 such that the pointed members 22 are driven into and penetrate the solder layer 18, and may also penetrate the underlying copper layer.

During assembly of the electronic package 10, the upper mold member 40 and lower mold member 42 are forced together so as to engage the shroud 30 at surface 34 and push the shroud 30 with conductive pins 20 downward toward circuit board 12. In doing so, the first terminal end of conductive pins 20 at the pointed members 22 engage in solder layer 18 of the respective contact pads 16 to form a physical and electrical contact thereto.

The electrical connector assembly 15 further includes a holder for securing the conductor pins 20 and shroud 30 in place to provide electrical and physical contact between the conductive pins 20 and the respective contact pads 16 on the circuit board 12. According to one embodiment, the holder is a mold compound 36 that essentially molds the shroud 30 and conductive pins 20 against the circuit board 12. In one exemplary embodiment, the mold compound 36 may include an overmolding material, such as an epoxy mold compound that bonds the assembly 15 together. The overmolding material 36 also serves to provide an overmolded package 10. The overmolding material 36 is essentially disposed in any location and shape sufficient to operate as a holder to secure the shroud 30 and conductive pins 20 in contact against the substrate 12. According to one exemplary embodiment, the overmolding material 36 may be an epoxy mold compound such as thermoset materials commercially available as Cookson 200SH-01 or Henkle MG33F-0602. The overmolding material 36 essentially cures to adhere the components of the assembled package together.

During assembly of the overmolded package 10 and its electrical connector assembly 15, the backplate 28, circuit board 12 and connector assembly 15 are enclosed by a mold which is then filled with the mold compound 36. One example of a mold is illustrated in dashed lines surrounding package 10 in FIG. 3, and has upper and lower mold members 40 and 42 that define an overmolding cavity. The shroud 30 and conductive pins 20 connected thereto are forced downward by the upper and lower mold members 40 and 42 to force the shroud 30 and the conductive pins 20 into a contact with contact pads 16, and a mold compound 36 is disposed in the cavity defined by the mold members 40 and 42 such that the mold compound 36 extends within any openings. The mold compound flows into openings. The mold compound 18 is allowed to cure such that the shroud 30 and conductive pins 20 are held in place against the substrate 12 and its contact pads 16 to maintain physical contact between the conductive pins 20 and corresponding contact pads 16.

The resultant structure of the overmolded package 10 is locked together after the overmold compound 36 is cured. The second terminal end 26 of conductive pins 20 within shroud 30 are adapted to matingly engage terminal connectors of another electrical device that would extend within the female receptacle of shroud 30. The second terminal ends 26 of conductive pins 20 thereby serve to form electrical connections with other devices according to any known connector assembly.

Figure 5:
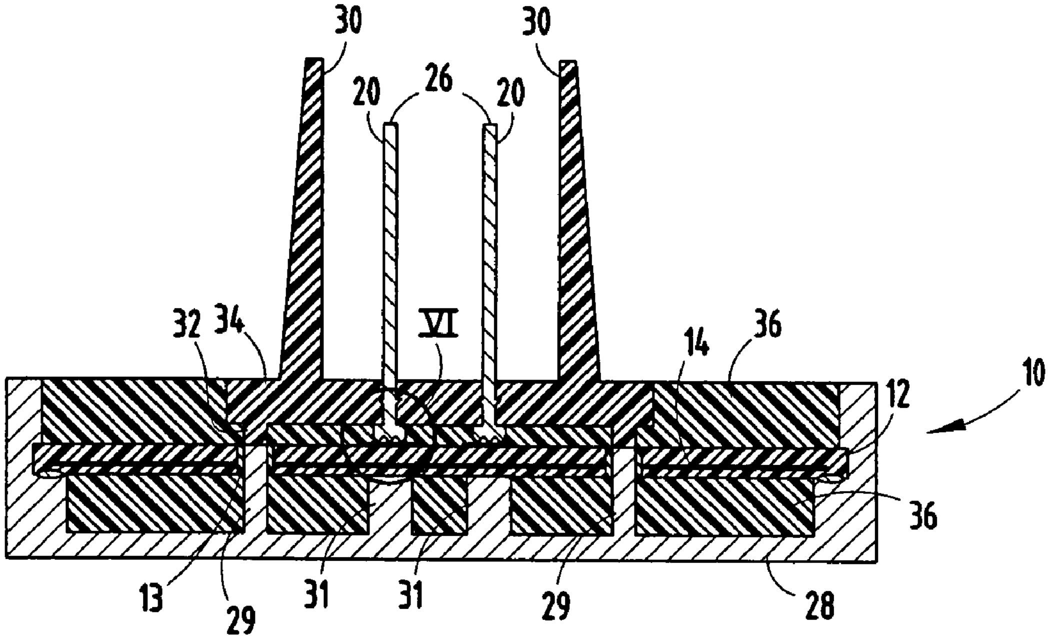
FIG. 5 is a cross-sectional view of an electronic package having a pin connector assembly according to a second embodiment.
Figure 6:
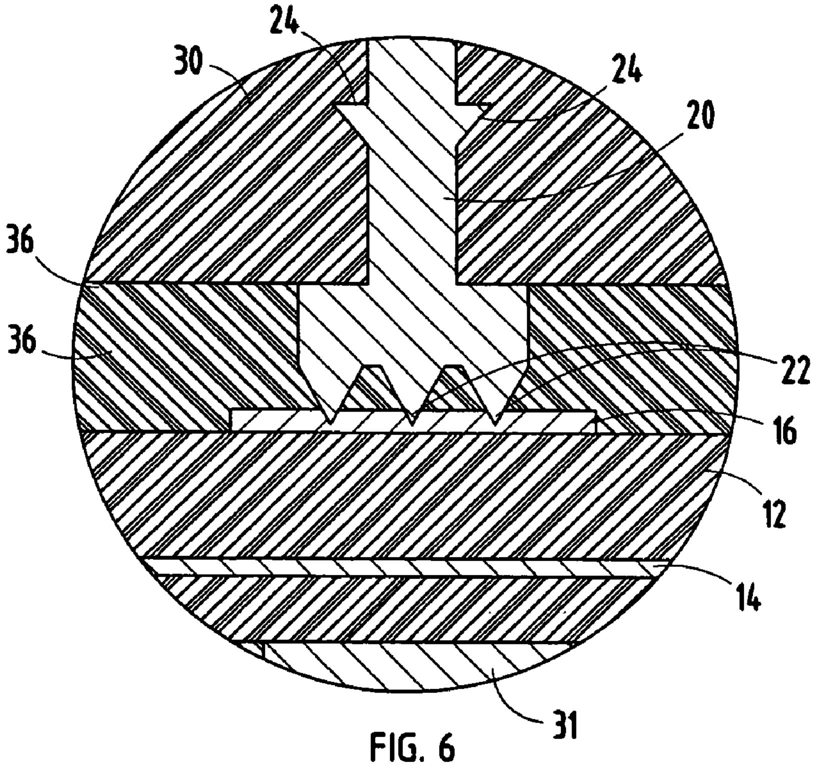
FIG. 6 is an enlarged cross-sectional view of section VI of the connector assembly shown in FIG. 5.

Referring to FIGS. 5 and 6, an electronic package 10 is shown having electrical connector assembly 15 according to a second embodiment of the present invention. The electrical connector assembly 15 according to the second embodiment has electrically conductive contact pads 16 formed on top of substrate 12 without the use of a solder layer. In this embodiment, the pointed members 22 at the first terminal ends of conductive pins 20 are forced into contact with the copper layer of the respective contact pads 16 absent any solder. In doing so, the pointed ends 22 engage and may penetrate at least a portion of the contact pads 16 to make a physical and electrical contact therewith. It should be appreciated that one or more pointed members 22 may be provided at the first terminal end of each conductive pin 20.

Figure 7:
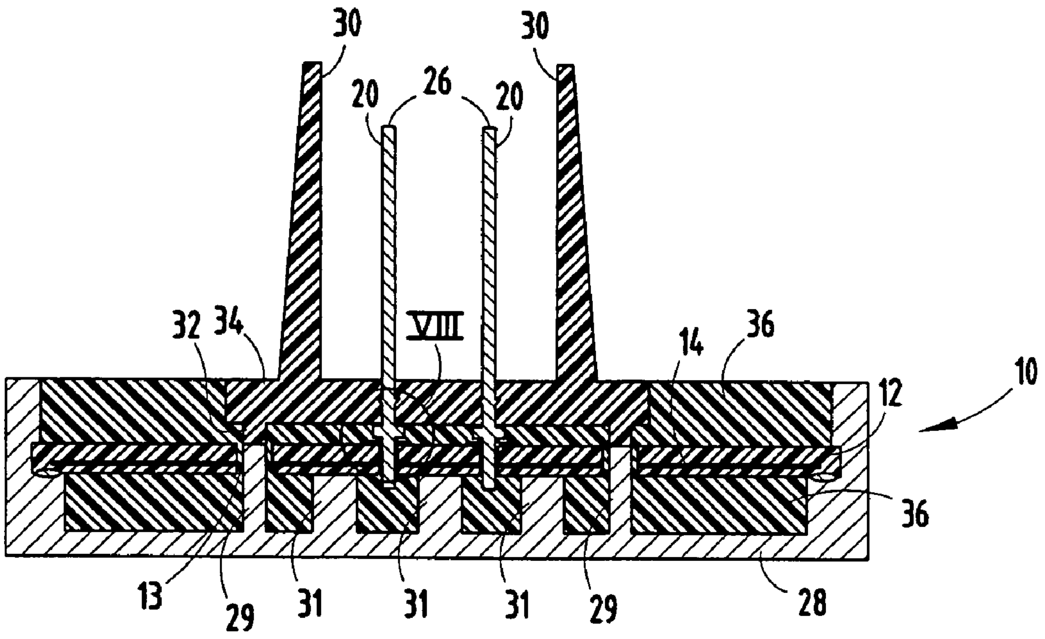
FIG. 7 is a cross-sectional view of an electronic package having a pin connector assembly according to a third embodiment.
Figure 8:
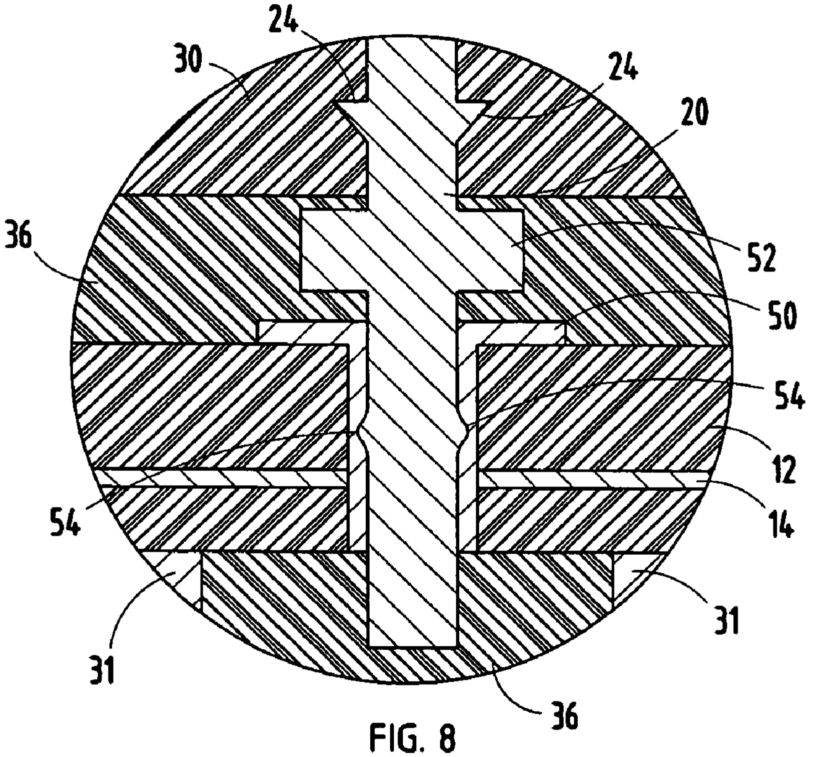
FIG. 8 is an enlarged cross-sectional view of section VII of the connector assembly shown in FIG. 7.

Referring to FIGS. 7 and 8, an overmolded package 10 is illustrated having an electrical connector assembly 15 according to a third embodiment. In the third embodiment, the electrical connector assembly 15 includes a substrate 12, such as a printed circuit board, having conductive thru holes formed by a conductive layer 50, such as copper, plated in an opening extending through the substrate 12 and at least extending on a top portion of the substrate 12. The conductive vias 50 serve as contact pads and allow for electrical circuit interconnection between multiple layers of the circuit board 12 as well as with the conductive pins 20. The conductive pins 20 are shown each having a first barb 24 for engaging the shroud 30, and a second barb 54 for engaging the conductive layer 50 of a conductive via 50 within the circuit board 12. The second barb 54 is angled on both the upper and lower sides and is essentially forced into the conductive via 50. The second barb 54 provides a pointed member extending from the side wall of the pin shaft. Additionally, each conductive pin 20 has an enlarged diameter section 52 that serves to prevent overextension of the conductive pin 20 into the circuit board 12. In this embodiment, the conductive pins 20 are forcibly pressed into the conductive vias 50 such that the second barb 54 of each conductive pin 20 engages the conductive layer 50 to form physical and electrical contact therewith.

Accordingly, the electrical connector assembly 15 according to the present invention advantageously provides for a reliable and easy to manufacture electrical connection that does not require a solder joining process. The resulting electrical connector assembly 15 consumes a small amount of space and is cost affordable.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An electrical connector assembly comprising:

a substrate;

electrical circuitry formed on the substrate;

an electrically conductive pin having at least one pointed member in forced contact with the electrical circuitry such that the at least one pointed member penetrates at least a portion of the electrical circuitry; and an overmolding material disposed on at least a portion of the conductive pin and the substrate for securing the conductive pin such that the pointed member of the conductive pin is held in contact with the electrical circuitry on the substrate.

2. The electrical connector assembly as defined in claim 1, wherein the electrically conductive pin comprises an elongated shaft having first and second terminal ends, wherein the pointed member is located at the first terminal end.

3. The electrical connector assembly as defined in claim 2, wherein the conductive pin comprises a plurality of pointed members at the first terminal end.

4. The electrical connector assembly as defined in claim 1, wherein the assembly comprises a plurality of electrically conductive pins aligned and in contact with the electrical circuitry.

5. The electrical connector assembly as defined in claim 1 further comprising a solder provided on at least one of the electrical circuitry.

6. The electrical connector assembly as defined in claim 1, wherein the pointed member comprises a barb formed on a shaft of the conductive pin for engaging electrical circuitry in a thru hole.

7. The electrical connector assembly as defined in claim 1, wherein the conductive pin is connected to a shroud.

8. The electrical connector assembly as defined in claim 1, wherein the electrical circuitry comprises circuit contact pads formed on a surface of the substrate.

9. The electrical connector assembly as defined in claim 1, wherein the connection between the conductive pin and electrical circuitry is free of solder.

10. An electrical connector assembly comprising:

a substrate comprising electrical circuitry having a contact pad;

an electrically conductive pin pressed into contact with the contact pad, wherein the conductive pin comprises a pointed member for contacting the contact pad such that the pointed member penetrates at least a portion of the contact pad;

a shroud engaged to the conductive pin; and an overmolding material disposed at least partially between the shroud and the substrate to the conductive pin in contact with the contact pad.

11. The electrical connector assembly as defined in claim 10, wherein the contact between the conductive pin and the contact pad is free of solder.

12. The electrical connector assembly as defined in claim 10, wherein the conductive pin comprises a plurality of pointed members at a first terminal end.

13. The electrical connector assembly as defined in claim 10 further comprising solder disposed on the contact pad.

14. The electrical connector assembly as defined in claim 10, wherein the pointed member comprises a barb formed on a shaft of the conductive pin for engaging electrical circuitry in a thru hole.

15. The electrical connector assembly as defined in claim 10, wherein the assembly comprises a plurality of electrically conductive pins aligned and in contact with the contact pads.

16. A method of assembling an electrical connector assembly to contact circuitry on a substrate, said method comprising the steps of:

providing a substrate having electrical circuitry;

disposing an electrical conductive pin on the electrical circuitry, such that a pointed member of the conductive pin is forced to penetrate at least a portion of the electrical circuitry;

forcing the conductive pin into contact with the electrical circuitry; and applying an overmolding material to the conductive pin and curing the overmolding material to hold the conductive pin such that the conductive pin maintains contact with the electrical circuitry.

17. The method as defined in claim 16 further comprising the step of assembling the conductive pin in a shroud, wherein the shroud is held in place with the substrate to hold the conductive pin in contact with the electrical circuitry.

18. The method as defined in claim 17, wherein the step of applying the overmolding material comprises applying the overmolding material disposed at least partially between the shroud and the substrate.

19. The method as defined in claim 16 further comprising the step of aligning a plurality of conductive pins with a plurality of contact pads such that each conductive pin is in contact with a contact pad.

20. The method as defined in claim 16, wherein the pointed member is provided at a terminal end of the conductive pin.

21. The method as defined in claim 16, wherein the pointed member is a barb on a shaft of the conductive pin extending into a thru hole.

* * * * *